US010444305B2

(12) United States Patent
Tomiha et al.

(10) Patent No.: US 10,444,305 B2
(45) Date of Patent: Oct. 15, 2019

(54) MAGNETIC RESONANCE IMAGING APPARATUS AND SPECIFIC ABSORPTION RATE CALCULATION METHOD

(71) Applicant: Toshiba Medical Systems Corporation, Otawara-shi (JP)

(72) Inventors: Sadanori Tomiha, Nasushiobara (JP); Xin Chen, Beachwood, OH (US)

(73) Assignee: Canon Medical Systems Corporation, Otawara-shi (JP)

(*) Notice: Subject to any disclaimer, the term of this patent is extended or adjusted under 35 U.S.C. 154(b) by 171 days.

(21) Appl. No.: 15/628,742

(22) Filed: Jun. 21, 2017

(65) Prior Publication Data

US 2018/0372814 A1  Dec. 27, 2018

(51) Int. Cl.
*G01R 33/28* (2006.01)
*G01R 33/36* (2006.01)
*G01R 33/58* (2006.01)
*G01R 33/54* (2006.01)

(52) U.S. Cl.
CPC ....... *G01R 33/288* (2013.01); *G01R 33/3642* (2013.01); *G01R 33/58* (2013.01); *G01R 33/36* (2013.01); *G01R 33/543* (2013.01)

(58) Field of Classification Search
None
See application file for complete search history.

(56) References Cited

U.S. PATENT DOCUMENTS

| | | | | |
|---|---|---|---|---|
| 8,941,380 B2* | 1/2015 | Graesslin | ........... | G01R 33/583 324/307 |
| 9,766,309 B2* | 9/2017 | Nakamura | ......... | G01R 33/3607 |
| 9,910,111 B2* | 3/2018 | Chen | .................... | G01R 33/543 |
| 10,180,470 B2* | 1/2019 | Chen | .................... | G01R 33/288 |
| 10,241,161 B2* | 3/2019 | Kaneko | ................. | A61B 5/748 |
| 2010/0244840 A1* | 9/2010 | McKinnon | ........... | G01R 33/288 324/322 |
| 2015/0185298 A1* | 7/2015 | Crozier | .................. | A61B 5/055 702/19 |

* cited by examiner

*Primary Examiner* — Jermele M Hollington
(74) *Attorney, Agent, or Firm* — Oblon, McClelland, Maier & Neustadt, L.L.P.

(57) ABSTRACT

According to one embodiment, a MRI apparatus includes a transmitter coil generating a RF magnetic field, a receiver coil, and processing circuitry. The receiver coil receives a MR signal generated by an object placed in an imaging space to which the RF magnetic field is applied. The processing circuitry calculates a specific absorption rate by using a first correction coefficient which indicates a characteristic that is inherent to the transmitter coil and relates to the generation of the RF magnetic field, and a second correction coefficient which indicates a characteristic that the receiver coil has on the RF magnetic field by electromagnetic coupling between the receiver coil and the RF magnetic field during a generation period of the RF magnetic field.

6 Claims, 5 Drawing Sheets

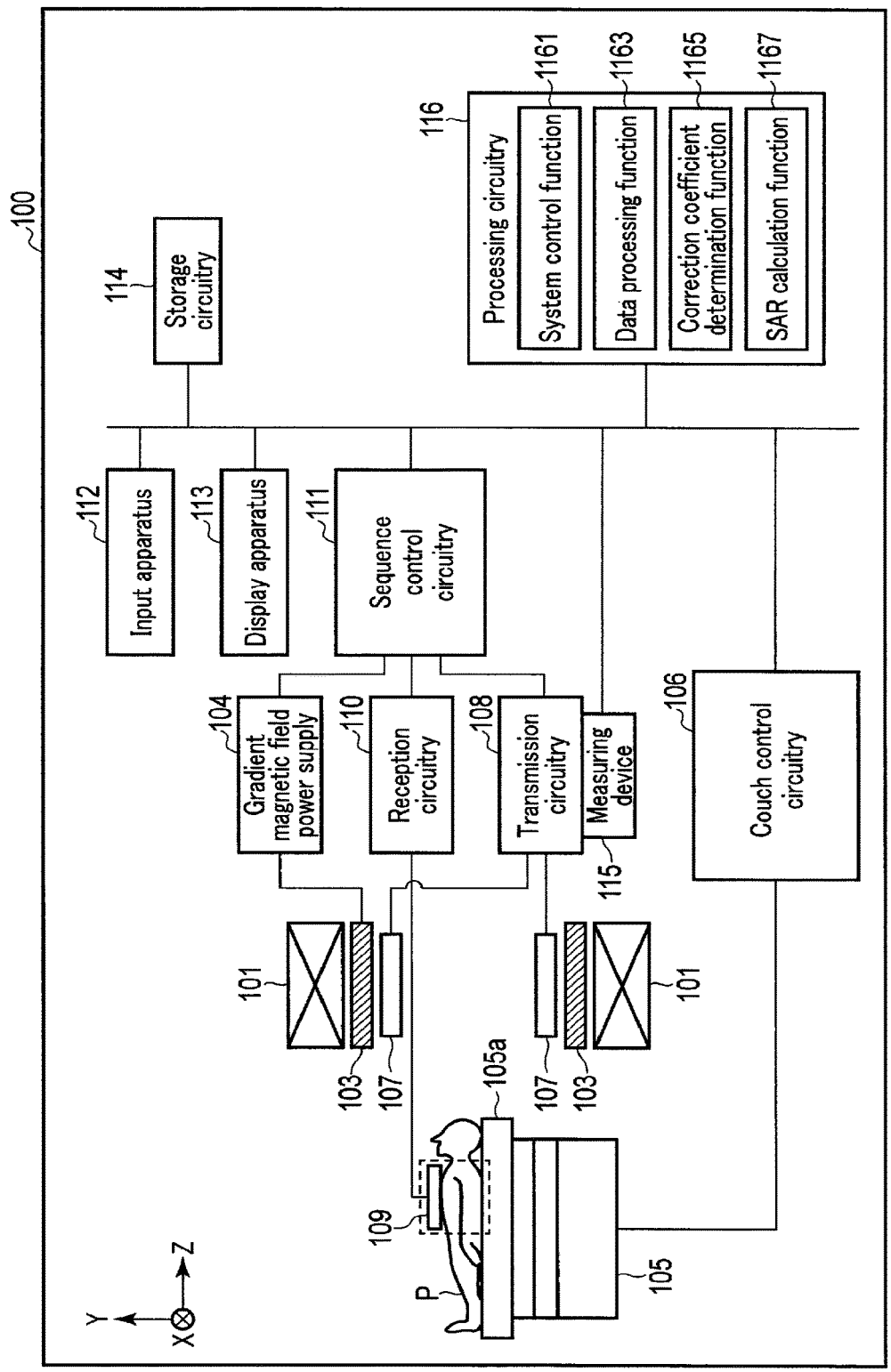
F I G. 1

| Transmitter (transmitter/receiver) coil ID (transmitter coil name, transmitter/receiver coil name) | First correction coefficient ($F_1$) |
|---|---|
| WBco(WB coil) | WB1 |
| Knco001(Knee coil 1) | Kn1 |
| Knco002(Knee coil 2) | Kn2 |
| ⋮ | ⋮ |

FIG. 2

| Receiver (transmitter/receiver) coil ID (receiver coil name, transmitter/receiver coil name) | Second correction coefficient ($F_2$) |
|---|---|
| Heco001(Head coil 1) | He1 |
| Heco002(Head coil 2) | He2 |
| ⋮ | ⋮ |
| Aboco001(Abdomen coil) | Ab |
| ⋮ | ⋮ |
| Knco001(Knee coil) | Kn |
| ⋮ | ⋮ |

FIG. 3

MAGNETIC RESONANCE IMAGING APPARATUS AND SPECIFIC ABSORPTION RATE CALCULATION METHOD

FIELD

Embodiments described herein relate generally to a magnetic resonance imaging apparatus and a specific absorption rate calculation method.

BACKGROUND

Magnetic resonance imaging (MRI) is an imaging method which excites a spin in an atomic nucleus of a subject placed in a static magnetic field by an RF (Radio Frequency) pulse of the Larmor frequency of this atomic nucleus, and generates an image from data of a magnetic resonance signal which occurs due to the excitation. In the magnetic resonance imaging, it is required that a SAR (Specific Absorption Rate), which is an index of energy of the RF pulse absorbed in a biological tissue of the subject, be suppressed to a limit value or less. The SAR is calculated, for example, by a calculation based on a pulse energy method. The SAR is an index relating to the safety for the subject.

When the pulse energy method is used in the calculation of the SAR, the SAR may be overestimated. The overestimation of the SAR restricts the operation of the MRI apparatus, and the usability of the MRI apparatus deteriorates.

BRIEF DESCRIPTION OF THE DRAWINGS

FIG. 1 is a block diagram illustrating an example of the configuration of a magnetic resonance imaging apparatus according to an embodiment.

FIG. 2 is a view illustrating an example of the correspondence of first correction coefficients to transmitter coil IDs (or transmitter/receiver coil IDs) in the embodiment.

FIG. 3 is a view illustrating an example of the correspondence of second correction coefficients to receiver coil IDs (or transmitter/receiver coil IDs) in the embodiment.

DETAILED DESCRIPTION

Figure 4:
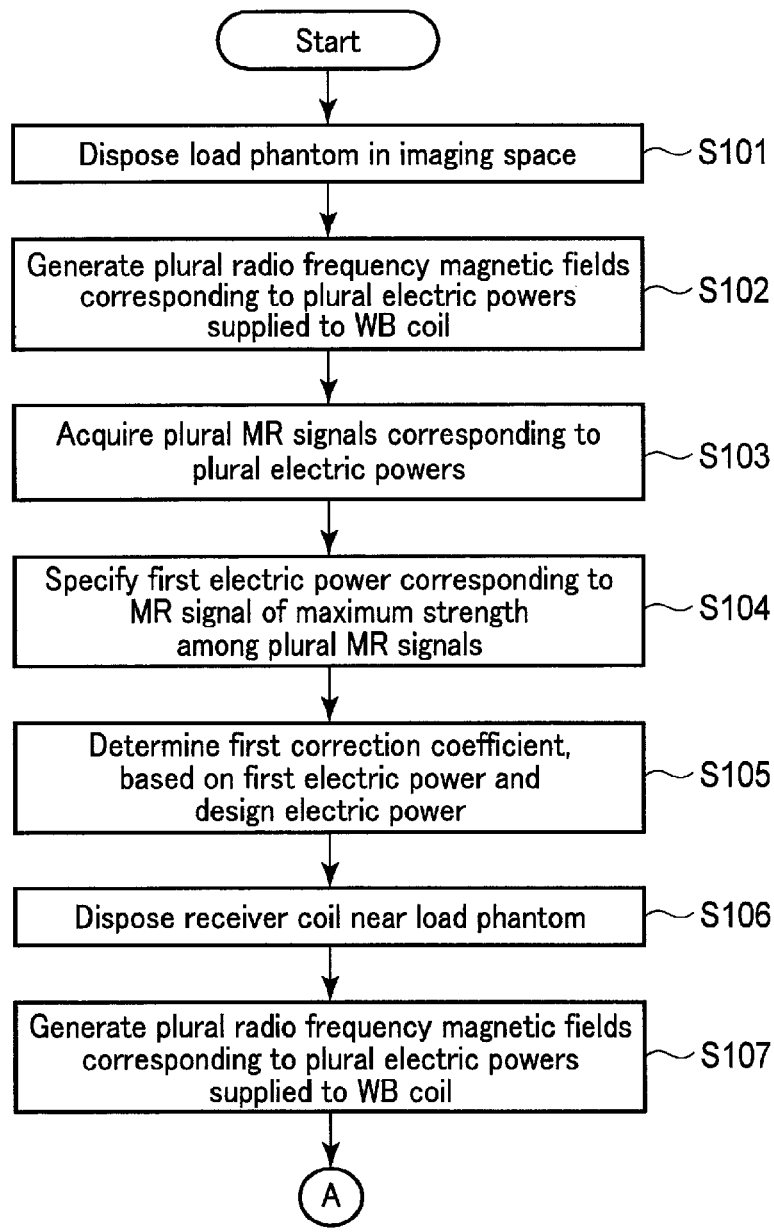
FIG. 4 is a flowchart illustrating an example of a process procedure relating to a calculation of the SAR in the embodiment.

In general, according to one embodiment, a magnetic resonance imaging apparatus includes a transmitter coil, a receiver coil, and processing circuitry. The transmitter coil generates a radio frequency magnetic field. The receiver coil receives a magnetic resonance signal generated by an object placed in an imaging space to which the radio frequency magnetic field is applied. The processing circuitry calculates a specific absorption rate by using a first correction coefficient which indicates a characteristic that is inherent to the transmitter coil and relates to generation of the radio frequency magnetic field, and a second correction coefficient which indicates a characteristic that the receiver coil has on the radio frequency magnetic field by electromagnetic coupling between the receiver coil and the radio frequency magnetic field during a generation period of the radio frequency magnetic field.

A magnetic resonance imaging apparatus (hereinafter referred to as "MRI apparatus") according to an embodiment will be described hereinafter with reference to the accompanying drawings. In the description below, the structural elements having substantially identical functions and structures will be denoted by like reference numerals, and an overlapping description will be given only where necessary.

FIG. 1 is a block diagram illustrating the configuration of an MRI apparatus 100 according to the embodiment. As illustrated in FIG. 1, the MRI apparatus 100 includes a static field magnet 101, a gradient coil 103, a gradient magnetic field power supply 104, a couch apparatus 105, couch control circuitry (couch controller) 106, a transmitter coil 107, transmission circuitry 108, a receiver coil 109, reception circuitry 110, sequence control circuitry (sequence controller) 111, an input apparatus (input unit) 112, a display apparatus (display unit) 113, storage circuitry (storage unit) 114, a measuring device 115, and processing circuitry (processor) 116. A subject P (e.g. human body) is not included in the MRI apparatus 100. In addition, the configuration illustrated in FIG. 1 is merely an example. For example, the couch control circuitry 106, sequence control circuitry 111 and processing circuitry 116 may be integrated or separately constructed, as needed. For example, the present embodiment may be implemented by providing single processing circuitry including the functions of the couch control circuitry 106, sequence control circuitry 111 and processing circuitry 116. Conversely, the processing circuitry 116 may be divided into four independent pieces of processing circuitry, and the respective processing circuitry pieces may be configured to execute a system control function 1161, a data processing function 1163, a correction coefficient determination function 1165 and a SAR (Specific Absorption Rate) calculation function 1167.

The static field magnet 101 is a magnet formed in a hollow, substantially cylindrical shape (including a shape with an elliptic cross section perpendicular to the center axis of the cylindrical shape). The static field magnet 101 generates a static field in the inside space. When the "hollow, substantially cylindrical shape" is mentioned in the embodiment to be described below, it is assumed that it includes a shape with an elliptic cross section perpendicular to the center axis of the cylindrical shape. Additionally, the static field magnet 101 is not limited to a substantially cylindrical shape but may be an open shape. The static field magnet 101 is, for example, a superconducting magnet, and is excited by being supplied with a current from the static magnetic field power supply. The static magnetic field power supply is a power supply apparatus which supplies a current to the static field magnet 101. Additionally, a permanent magnet may also be used for the static field magnet 101. In this case, the MRI apparatus 100 does not need to include the static magnetic field power supply, which may be provided separately from the MRI apparatus 100.

The gradient coil 103 is a coil which is formed in a hollow, substantially cylindrical shape, and is placed in the inside of the static field magnet 101. The gradient coil 103 is formed by combining three coils corresponding to X-, Y- and Z-axes which are orthogonal to each other. These three coils individually receive currents from the gradient magnetic field power supply 104, and generate gradient fields with intensities varying along the X-, Y- and Z-axes. The gradient fields along the X-, Y- and Z-axes, which are generated by the gradient coil 103, are, for example, a gradient field Gs for slice encoding, a gradient field Ge for phase encoding, and a gradient field Gr for readout encoding. In addition, the gradient magnetic field power supply 104 is a power supply apparatus which supplies a current to the gradient coil 103.

The couch apparatus 105 includes a couch top 105a on which a subject P is placed, a base (not shown), and a couch driving apparatus (not shown). The base is a housing including a motor or an actuator, which can move the couch top 105a by the couch driving apparatus in an up-and-down direction (a direction perpendicular to the direction of the body axis of the subject P). The couch driving apparatus is a motor or an actuator, which inserts/draws the couch top 105a, on which the subject P is placed, into/from a substantially cylindrical opening region provided in the MRI apparatus 100. The couch top 105a is a plate-shaped apparatus on which the subject P is placed, and which is movable by the couch driving apparatus along the body axis direction of the subject P and along the direction perpendicular to the body axis.

The couch control circuitry 106 is connected to the couch apparatus 105. The couch control circuitry 106 controls the operation of the couch apparatus 105 by outputting an electric signal for control to the couch apparatus 105. For example, if an instruction to move the couch top 105a in the longitudinal direction, up-and-down direction or right-and-left direction is input to the couch control circuitry 106 via the input apparatus 112, the couch control circuitry 106 operates a driving mechanism of the couch top 105a so as to move the couch top 105a in accordance with the accepted instruction signal.

The transmitter coil 107 is a coil which is formed in a hollow, substantially cylindrical shape, and is placed in the inside of the gradient coil 103. The transmitter coil 107 receives RF (Radio Frequency) pulses which are supplied from the transmission circuitry 108, and generates a radio frequency magnetic field. The transmitter coil 107 is, for example, a whole body (WB) coil enveloping an imaging space. The WB coil is a transmitter/receiver coil which functions also as a coil which can receive a magnetic resonance signal (MR signal). The transmitter coil is not limited to the WB coil, and may be, for example, a transmission-only coil corresponding to an imaging region, or may be a transmission/reception coil functioning both for transmission of a radio frequency magnetic field and for reception of a MR signal.

The transmission circuitry 108 is electric circuitry which supplies to the transmitter coil 107 RF pulses corresponding to a resonance frequency (Larmor frequency) which is determined by the nuclide that is a target, and the intensity of the magnetic field that is generated by the static field magnet 101. The transmission circuitry 108 may output a plurality of RF pulses corresponding to a plurality of electric powers to the transmitter coil 107 at a time of installing the MRI apparatus 100 in a hospital, etc., at a time of performing calibration using a various kinds of phantoms, and at a time of performing maintenance for the MRI apparatus 100.

The receiver coil 109 is a coil which is placed in the inside of the gradient coil 103, and receives an MR signal which is generated from an object, such as the subject P or phantom placed in the imaging space, due to the influence of the radio frequency magnetic field. Upon receiving the MR signal, the receiver coil 109 outputs the received signal to the reception circuitry 110. The receiver coil 109 is, for example, a coil array including a plurality of coil elements. In the meantime, the receiver coil 109 may include a function of generating a radio frequency magnetic field corresponding to an imaging region, that is, a function as the transmitter coil 107.

The reception circuitry 110 converts the MR signal, which is output from the receiver coil 109, to digital MR data. The reception circuitry 110 transmits the MR data to the sequence control circuitry 111.

The sequence control circuitry 111 executes various kinds of pulse sequences. Specifically, the sequence control circuitry 111 reads in sequence execution data which is output from the processing circuitry 116, and drives the gradient magnetic field power supply 104, transmission circuitry 108 and reception circuitry 110, thereby executing various kinds of pulse sequences. The sequence execution data is information which defines a pulse sequence that indicates a procedure for acquiring MR data. Specifically, the sequence execution data is information which defines the timing of supply of current to the gradient coil 103 by the gradient magnetic field power supply 104, the strength of the supplied current, the strength of an RF pulse current which the transmission circuitry 108 supplies to the transmitter coil 107, the timing of supply of the RF pulse current, and the detection timing at which the reception circuitry 110 detects an MR signal. The sequence control circuitry 111 outputs MR data, which is received from the reception circuitry 110, to the storage circuitry 114 as a result of execution of various pulse sequences.

The input apparatus 112 accepts various instructions and information inputs from an operator. The input apparatus 112 is, for example, a pointing device such as a mouse, a selection device such as a mode change-over switch, or an input device such as a keyboard. In addition, a GUI (Graphical User Interface) may be used for the input apparatus 112.

The display apparatus 113 displays, under the control of the system control function 1161 in the processing circuitry 116, a GUI for accepting an input of an imaging condition, an image generated by the data processing function 1163 in the processing circuitry 116, and the like. In addition, the display apparatus 113 displays a SAR calculated by the SAR calculation function 1167. In the meantime, when the SAR exceeds a limit value, the display apparatus 113 may display an alert. The display apparatus 113 is composed of, for example, a display of any kind, such as a liquid crystal display. In addition, the display apparatus 113 may be provided on a gantry apparatus side that is a main body of the MRI apparatus 100, or may be provided on a console apparatus side which is provided in a different room from the gantry apparatus and operates the MRI apparatus 100.

The storage circuitry 114 stores various kinds of data. For example, the storage circuitry 114 is realized by, for example, a semiconductor memory device such as a RAM (Random Access Memory) or a flash memory, a hard disk, an optical disc, etc. The storage circuitry 114 stores MR data which is input via the sequence control circuitry 111 and the reception circuitry 110. In addition, the storage circuitry 114 stores a limit value relating to the SAR. The limit value relating to the SAR is a value for judging whether the SAR, which is calculated by the SAR calculation function 1167, exceeds safety limit or not.

The storage circuitry 114 stores an electric power in design (hereinafter referred to as "design electric power") which is supplied to the transmitter coil 107 in order to generate a maximum magnetic resonance signal in a state in which no other coil is placed in the imaging space. Specifically, the design electric power is an electric power (power) in design necessary for generating a radio frequency magnetic field which turns the spin of an atomic nucleus in the subject P or in various phantoms to 180°. The design electric power is, for example, determined in advance by simulation or the like. The design electric power is an electric power which is a so-called "180° condition". Additionally, the design electric power may be stored for each transmitter coil, or for each transmitter/receiver coil. The storage circuitry 114 stores a calculation formula of the SAR. The storage circuitry 114 stores a first correction coefficient and a second correction coefficient, which are determined by the correction coefficient determination function 1165. The calculation formula of the SAR, the first correction coefficient and second correction coefficient will be described later in detail.

The measuring device 115 measures, for example, an electric power which is output from an RF amplifier (not shown) in the transmission circuitry 108 to the transmitter coil 107. The measuring device 115 is realized by, for example, a power meter which measures a plurality of electric powers that are supplied to the transmitter coil 107. The measuring device 115 outputs the measured electric powers to the processing circuitry 116.

The processing circuitry 116 includes the system control function 1161, data processing function 1163, correction coefficient determination function 1165 and SAR calculation function 1167. For example, the processing circuitry 116 is realized by a processor.

The term "processor" used in the above description means, for example, a CPU (Central Processing Unit), a GPU (Graphics Processing Unit), or circuitry such as an ASIC (Application Specific Integrated Circuit), or a programmable logic device (e.g. SPLD (Simple Programmable Logic Device), CLPD (Complex Programmable Logic Device), FPGA (Field Programmable Gate Array).

The processor realizes various functions by reading out and executing programs stored in the storage circuitry 114. Alternatively, instead of storing programs in the storage circuitry 114, the programs may be directly incorporated in the circuitry of the processor. In this case, the processor realizes various functions by reading out and executing the programs which are incorporated in the circuitry. In the meantime, the couch control circuitry 106, transmission circuitry 108, reception circuitry 110, sequence control circuitry 111 may include electronic circuitry such as the above-described processors.

The processing circuitry 116, which realizes the system control function 1161, executes overall control of the MRI apparatus 100 by controlling the structural elements and functions in the MRI apparatus 100. The processing circuitry 116 accepts inputs of various kinds of parameters relating to pulse sequences from the operator via the input apparatus 112, and generates sequence execution data by reading in the accepted parameters. Next, by transmitting the generated sequence execution data to the sequence control circuitry 111, the processing circuitry 116 directs the sequence control circuitry 111 to execute various pulse sequences. The system control function 1161 is an example of a system controller.

The processing circuitry 116, which realizes the data processing function 1163, generates spectrum data of a desired nuclear spin in the subject P or image data, by reading in MR data from the storage circuitry 114 and applying a reconstruction process, such as Fourier transform, to the MR data. The processing circuitry 116, which realizes the data processing function 1163, is an example of a data processor.

The configuration, etc. of the magnetic resonance imaging apparatus 100 according to the present embodiment have been described above. With this configuration, in the magnetic resonance imaging apparatus 100 according to this embodiment, the SAR is calculated by using the first correction coefficient which indicates a characteristic that is inherent to the transmitter coil 107 and relates to the generation of the radio frequency magnetic field, and the second correction coefficient which indicates a characteristic that the receiver coil 109 has on the radio frequency magnetic field by the electromagnetic coupling between the receiver coil 109 and the radio frequency magnetic field during the generation period of the radio frequency magnetic field. Hereinafter, the magnetic resonance imaging apparatus 100 according to the present embodiment will be described in detail.

The processing circuitry 116, which realizes the correction coefficient determination function 1165, determines the first correction coefficient which indicates the characteristic that is inherent to the transmitter coil 107 and relates to the generation of the radio frequency magnetic field, and the second correction coefficient which indicates the characteristic that the receiver coil 109 has on the radio frequency magnetic field by the electromagnetic coupling between the receiver coil 109 and the radio frequency magnetic field during the generation period of the radio frequency magnetic field. The first and the second correction coefficients will be described below. The process procedure relating to the determination of the first and the second correction coefficients will be described later with reference to flowcharts, etc.

The first correction coefficient corresponds to a difference between an electric power (hereinafter referred to as "first transmission power") and a design electric power. The first transmission power is an electric power for generating a radio frequency magnetic field corresponding to the 180° condition without any arbitrary coil in the imaging space after the MRI apparatus 100 is installed in a hospital or the like. Specifically, the first correction coefficient is a coefficient for correcting the power of the radio frequency magnetic field in design by the design electric power to the power of the radio frequency magnetic field which is generated after the MRI apparatus 100 is installed. The processing circuitry 116 determines the first correction coefficient, based on the design electric power and the first transmission power.

The first transmission power varies due to, for example, an error of the attachment position of the RF shield and WB coil in relation to the position in design in the gantry at a time of installation of the MRI apparatus 100 in a hospital or the like, an error relative to the design shape of the RF shield, and adjustment of the WB coil based on the performance in design of the WB coil. Thus, the first correction coefficient is a value which indicates the characteristic that is inherent to the transmitter coil 107 and relates to the generation of the radio frequency magnetic field. Specifically, the first correction coefficient is a value which varies among a plurality of MRI apparatuses, and corresponds to the transmission efficiency of the radio frequency magnetic field to the subject P in each of the respective MRI apparatuses. Since the transmission efficiency is proportional to the first transmission power, the processing circuitry 116 determines, for example, the ratio of the first transmission power to the design electric power as the first correction coefficient. In the above description of the first correction coefficient, the transmitter coil 107 has been described as the WB coil. However, when local transmitter coils are used in accordance with imaging regions of the subject, the first correction coefficient becomes a value which varies in association with the WB coil and each local transmitter coil.

The second correction coefficient corresponds to a difference between an electric power (hereinafter referred to as "second transmission power") and the first transmission power, the second transmission power being an electric power for generating a radio frequency magnetic field corresponding to the 180° condition with an arbitrary coil placed in the imaging space after the MRI apparatus 100 is installed in a hospital or the like. Specifically, the second correction coefficient is a coefficient for correcting the first transmission power to the power of the radio frequency magnetic field to which the influence on the radio frequency magnetic field by various coils, such as the receiver coil 109 or transmitter/receiver coil placed in the imaging space, is added. The processing circuitry 116 determines the second correction coefficient, based on the first transmission power and second transmission power.

The second transmission power varies due to electromagnetic coupling between the various coils and transmitter coil 107 placed in the imaging space via the radio frequency magnetic field, for example, the absorption of energy of the radio frequency magnetic field (decrease in transmission efficiency) by the receiver coil 109 placed in the imaging space, and the excitation (increase in transmission efficiency) in the receiver coil 109 due to this absorption. Thus, the second correction coefficient becomes a value which indicates the characteristic that the receiver coil has on the radio frequency magnetic field by the electromagnetic coupling between the various coils placed in the imaging space and the radio frequency magnetic field during the generation period of the radio frequency magnetic field. Specifically, the second correction coefficient is a value that varies between various coils which can be placed in the imaging space, and corresponds to the transmission efficiency of the radio frequency magnetic field to the subject P, with the influence on the radio frequency magnetic field by the various coils placed in the imaging space being taken into account. Since the transmission efficiency is proportional to the second transmission power, the processing circuitry 116 determines, for example, the ratio of the second transmission power to the first transmission power as the second correction coefficient.

The processing circuitry 116, which realizes the correction coefficient determination function 1165, executes the determination of the first correction coefficient and second correction coefficient at a time of installing the MRI apparatus 100 in a hospital or the like. In the meantime, the processing circuitry 116 may execute the determination of the first correction coefficient and second correction coefficient at a time of performing calibration using various phantoms, or at a time of performing maintenance of the MRI apparatus 100. The processing circuitry 116 directs the storage circuitry 114 to store the determined first correction coefficient and second correction coefficient in association with coil IDs. The processing circuitry 116, which realizes the correction coefficient determination function 1165, corresponds to a correction coefficient determination unit.

FIG. 2 is a view illustrating an example of the correspondence of the first correction coefficients to transmitter coil IDs (or transmitter/receiver coil IDs). As illustrated in FIG. 2, the first correction coefficients are associated with the transmitter coil IDs and transmitter/receiver coil IDs used in the MRI apparatus 100. FIG. 3 is a view illustrating an example of the correspondence of the second correction coefficients to receiver coil IDs (or transmitter/receiver coil IDs). As illustrated in FIG. 3, the second correction coefficients are associated with the receiver coil IDs and transmitter/receiver coil IDs used in the MRI apparatus 100.

The processing circuitry 116, which realizes the SAR calculation function 1167, reads out a calculation formula of the SAR, which is stored in the storage circuitry 114. The following formula (1) is an example of the calculation formula of the SAR in the present embodiment.

$$SAR_{part}(t) \propto \int_{t-t_0}^{t} dt' \left( \frac{1}{t_0} \times \frac{1}{M \times WR_{part}} \times P_{realout}(t') \times WBPR \times RFR_{part} \times F_1 \times F_2 \right) \quad (1)$$

$SAR_{part}(t)$ in the left side of formula (1) indicates a SAR value for an imaging region of the subject P. In the right side of formula (1), $t_0$ is a predetermined time width, and corresponds to a minimum unit relating to the calculation of the SAR. The predetermined time width corresponds to a repetition time (TR) in a pulse sequence. In the meantime, when the pulse sequence in the calculation target of the SAR is an imaging sequence in synchronism with a biological signal, such as electrocardiogram gating or respiratory gating, and when the cycle of such synchronism varies, $t_0$ in the right side of formula (1) may be varied in accordance with the variation of the cycle.

M in the right side of formula (1) is the mass of the subject P, that is, the whole body weight. $WR_{part}$ in the right side of formula (1) is the ratio of the mass of the imaging target in the subject P to the mass M of the subject P (hereinafter referred to as "mass ratio"). $P_{realout}(t')$ in the right side of formula (1) is the electric power of the RF pulse, which is supplied to the transmitter coil 107 at a time instant t' with the predetermined time width $t_0$. WBPR in the right side of formula (1) is the ratio of an electric power accumulated in the subject P to the electric power that is supplied to the transmitter coil (hereinafter referred to as "power ratio"). The power ratio WBPR reflects the disposition of the subject P relative to the transmitter coil 107, and exhibits a strong linear relation to the body surface area of the subject P. Thus, as indicated by the following formula (2), the power ratio WBPR is proportional to the body surface area (BSA).

$$WBPR = \underline{a} \times BSA + b \quad (2)$$

where $\underline{a}$ is an inclination, and b is an intercept.

$RFR_{part}$ in the right side of formula (1) is the number of RF pulses (pulse number) which are supplied to the transmitter coil 107, that is, the number of generations of the radio frequency magnetic field, and is also called "duty". In the right side of formula (1), $F_1$ is the first correction coefficient, and $F_2$ is the second correction coefficient.

For example, based on the sequence execution data, the processing circuitry 116, which realizes the SAR calculation function 1167, determines, prior to the calculation of the SAR, the power $P_{realout}(t')$ of RF pulses, the duty $RFR_{part}$, predetermined time width $t_0$, and mass ratio $WR_{part}$. In the meantime, when the SAR is calculated while the MR imaging on the subject P is being executed, the processing circuitry 116 may acquire the power $P_{realout}(t')$ of RF pulses from the measuring device 115, and may acquire the predetermined time width $t_0$ from various biological signal detectors, such as an electrocardiograph and a respiration sensor, which relate to biological signal gated imaging.

The processing circuitry 116, which realizes the SAR calculation function 1167, determines the mass M of the subject P and the body surface area BSA, based on patient information, etc. relating to the subject P. The processing circuitry 116 determines the power ratio WBPR by using the inclination a and intercept b, which are stored in the memory, and the determined body surface area BSA. In the meantime, the processing circuitry 116 may determine the power ratio WBPR by using a correspondence table (look-up table) of the power ratio WBPR to the body surface area BSA using the inclination a and intercept b, and the determined body surface area BSA.

For example, based on the sequence execution data, the processing circuitry 116, which realizes the SAR calculation function 1167, reads out, prior to the calculation of the SAR, the first correction coefficient $F_1$ and, second correction coefficient $F_2$ from the storage circuitry 114. For example, in the MR imaging which is executed by the sequence execution data, when the WE coil is used as the transmitter coil 107, the processing circuitry 116 reads out, as illustrated in FIG. 2, a first correction coefficient WB1, which corresponds to the ID of the WB coil, from the storage circuitry 114. In the MR imaging which is executed by the sequence execution data, when an abdomen coil is used as the receiver coil 109, the processing circuitry 116 reads out, as illustrated in FIG. 3, a second correction coefficient Ab, which corresponds to the ID of the abdomen coil, from the storage circuitry 114.

The processing circuitry 116, which realizes the SAR calculation function 1167, calculates a multiplication value by multiplying the power $P_{realout}$ (t') of RF pulses, duty $RFR_{part}$, power ratio WBPR, first correction coefficient $F_1$ and second correction coefficient $F_2$. The processing circuitry 116 calculates a division value by dividing the calculated multiplication value by the mass (M×$WR_{part}$) of the imaging region in the subject P, and the predetermined time width $t_0$. This division value is the to-be-integrated object in formula (1). The processing circuitry 116 calculates the SAR by integrating the division value over the predetermined time width $t_0$ from a time instant (t−$t_0$) preceding a time instant t by a predetermined time width $t_0$, to the time instant t.

The processing circuitry 116, which realizes the SAR calculation function 1167, judges whether the calculated SAR exceeds a limit value or not. If the SAR exceeds the limit value, the processing circuitry 116, which realizes the system control function 1161, controls the MRI apparatus 100 not to execute imaging on the subject P. In the meantime, if the SAR exceeds the limit value in the case in which the calculation of the SAR is being executed during the execution of MR imaging, the processing circuitry 116, which realizes the system control function 1161, may control the MRI apparatus 100 to stop MR imaging on the subject. In addition, if the SAR exceeds the limit value, the processing circuitry 116, which realizes the SAR calculation function 1167, controls the display apparatus 113 to display an alert. The processing circuitry 116, which realizes the SAR calculation function 1167, corresponds to a SAR calculator.

(Operation)

Figure 5:
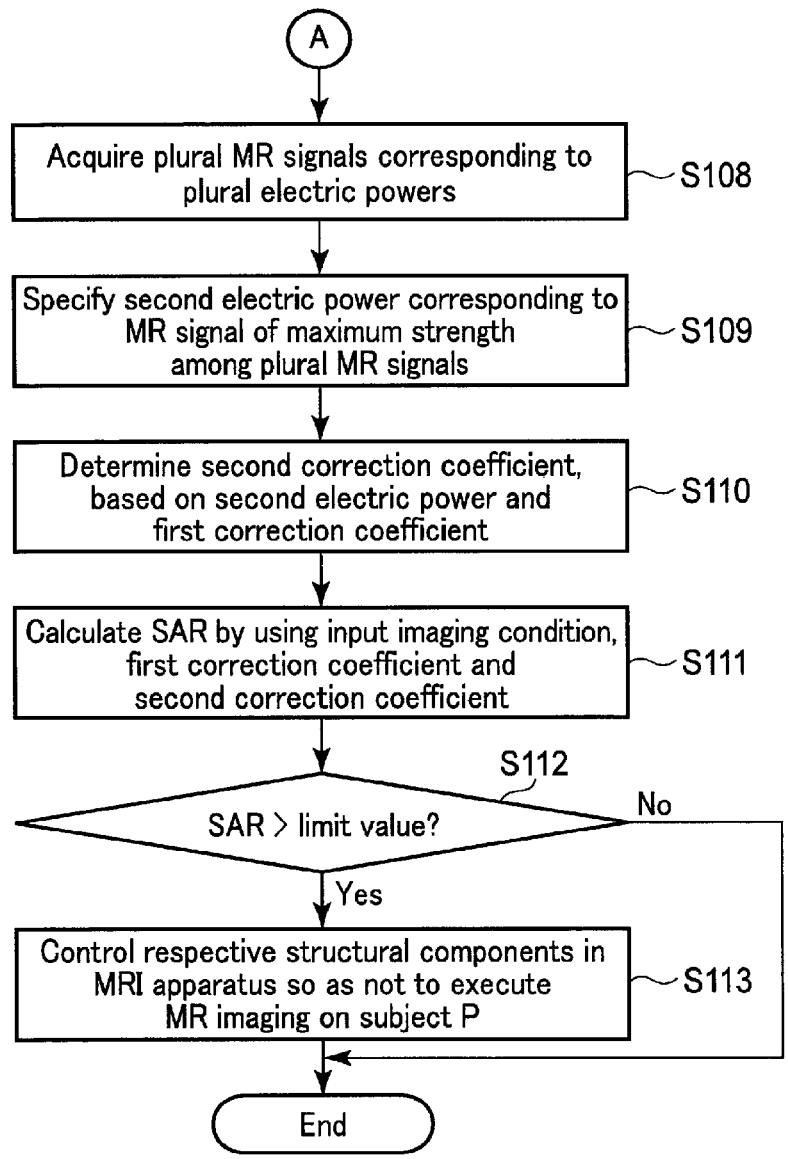
FIG. 5 is a flowchart illustrating the example of the process procedure relating to the calculation of the SAR in the embodiment.

A processing operation in the present embodiment will now be described. FIG. 4 and FIG. 5 are flowcharts illustrating an example of a process procedure of the calculation of the SAR in the embodiment.

(Step S101)

At a time of installing the MRI apparatus 100 in a hospital, etc., at a time of performing calibration using various kinds of phantoms, or at a time of performing maintenance for the MRI apparatus 100, a load phantom is placed in an imaging space. Additionally, a no-load phantom may be used. At this time, an arbitrary coil, which is not related to the determination of the first correction coefficient, is not placed in the imaging space inside the transmitter coil 107 which is related to the determination of the first correction coefficient. Hereinafter, in order to simplify the description, it is assumed that the transmitter coil 107 is the WB coil. Alternatively, an arbitrary transmitter/receiver coil may be used in place of the WB coil. In addition, a transmission-only coil may be used in place of the WB coil.

(Step S102)

A plurality of electric powers are supplied to the WB coil. The WB coil generates a plurality of radio frequency magnetic fields corresponding to the plural electric powers. The load phantom generates an MR signal in accordance with the application of the radio frequency magnetic field. The WB coil receives the MR signal corresponding to the radio frequency magnetic field.

(Step S103)

By the reception of the MR signal by the WB coil and reception circuitry 110, a plurality of MR signals corresponding to the plural electric powers are acquired. The plural MR signals are output to the processing circuitry 116. The strengths of the plural MR signals are distributed, for example, in an upward convex shape, in relation to the plural electric powers.

(Step 104)

Figure 6:
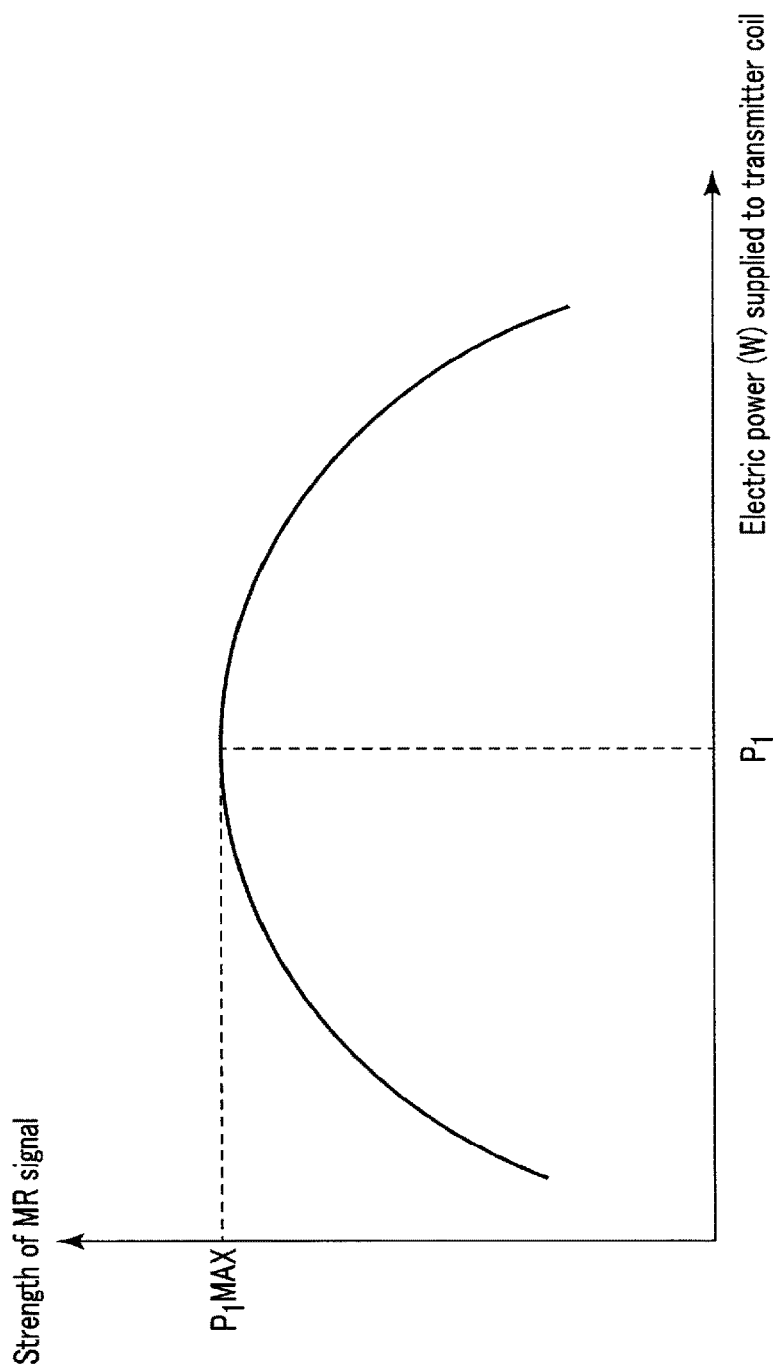
FIG. 6 is a view illustrating an example of a variation of the strength of an MR signal relative to a plurality of electric powers.

The processing circuitry 116, which realizes the correction coefficient determination function 1165, specifies the strength of the maximum MR signal (hereinafter referred to as "first maximum strength") among the strengths of the plural MR signals. Then, among the plural electric powers, the electric power (hereinafter "first electric power") corresponding to the first maximum strength is specified. FIG. 6 is a view illustrating an example of a variation of the strength of the MR signal in relation to a plurality of electric powers. As illustrated in FIG. 6, in this step, a first maximum strength $P_1MAX$ and a first electric power $P_1$ are specified.

(Step S105)

The processing circuitry 116, which realizes the correction coefficient determination function 1165, reads out the design electric power from the storage circuitry 114. Based on the design electric power and the first electric power, a first correction coefficient is determined. In the meantime, as illustrated in FIG. 2, if a transmitter/receiver coil, which is used in the MRI apparatus 100, exists in addition to the WB coil, the process of step S101 to step S105 is repeated. By the process of step S101 to step S105, first correction coefficients, which relate to the transmitter/receiver coil, such as the WB coil, and the transmission-only coil, are determined. As illustrated in FIG. 2, the first correction coefficients are stored in the storage circuitry 114, for example, as a look-up table.

(Step S106)

The receiver coil 109 is placed in the imaging space near the load phantom or in contact with the load phantom. Alternatively, instead of the receiver coil 109, a transmitter/receiver coil may be placed.

(Step 107)

As in the process of step S102, a plurality of electric powers are supplied to the WB coil, and the WB coil generates a plurality of radio frequency magnetic fields corresponding to the plural electric powers.

(Step S108)

By the reception of the MR signal by the receiver coil 109 and reception circuitry 110, a plurality of MR signals corresponding to the plural electric powers are acquired. The plural MR signals are output to the processing circuitry 116. The strengths of the plural MR signals are distributed, as in FIG. 6, in an upward convex shape in relation to the plural electric powers.

(Step 109)

Like the process in step S104, the processing circuitry 116, which realizes the correction coefficient determination function 1165, specifies the strength of the maximum MR signal (hereinafter referred to as "second maximum strength") among the strengths of the plural MR signals. Then, among the plural electric powers, the electric power (hereinafter "second electric power") corresponding to the second maximum strength is specified.

(Step S110)

The processing circuitry 116, which realizes the correction coefficient determination function 1165, reads out the first correction coefficient from the storage circuitry 114. Based on the first correction coefficient and the second electric power, a second correction coefficient is determined. As illustrated in FIG. 3, the process of step S106 to step S110 is repeated for a plurality of receiver coils. By the process of step S106 to step S110, second correction coefficients, which relate to the plural receiver coils 109 and transmitter/receiver coil, are determined. As illustrated in FIG. 3, the second correction coefficients are stored in the storage circuitry 114, for example, as a look-up table.

(Step S111)

If an imaging condition is input via the input apparatus 112, the processing circuitry 116 generates sequence execution data. Based on the sequence execution data and the imaging condition, various parameters relating to the to-be-integrated object of the left side in the calculation formula (1) of the SAR are set. For example, in accordance with the kinds of the transmitter coil 107 and receiver coil 109 which are used in the MR imaging on the subject P, the processing circuitry 116 reads out the first correction coefficient $F_1$ and second correction coefficient $F_2$ from the storage circuitry 114. The SAR is calculated by the processing circuitry 116 which realizes the SAR calculation function 1167.

(Step S112)

The limit value, which is read out from the storage circuitry 114, and the calculated SAR are compared. If the SAR is not greater than the limit value (No in step S112), the present process procedure is terminated. If the SAR is greater than the limit value (Yes in step S112), the process of step S113 is executed.

(Step S113)

The respective structural components in the MRI apparatus 100 are controlled not to execute MR imaging on the subject P. At this time, a message indicating that the SAR exceeds the limit value may be displayed on the display. The above step S111 to step S113 are executed before the execution of MR imaging on the subject P. Alternatively, the step S111 to step S113 may be executed during the MR imaging on the subject P According to the above-described configuration, the following advantageous effects can be obtained.

According to the MRI apparatus 100 in the present embodiment, the SAR can be calculated by using the first correction coefficient $F_1$ corresponding to the inherent characteristic of the transmitter coil 107, which generates the radio frequency magnetic field, and that relates to the generation of the radio frequency magnetic field; the second correction coefficient $F_2$ which indicates the characteristic that the receiver coil 109 has on the radio frequency magnetic field by the electromagnetic coupling between the receiver coil 109 and the radio frequency magnetic field during the generation period of the radio frequency magnetic field; the correlation between the power ratio WBPR, which indicates the ratio of the electric power accumulated in the subject P to the electric power supplied to the transmitter coil 107, and the body surface area BSA of the subject P; and the power $P_{realout}(t')$ that is supplied to the transmitter 107.

In addition, according to the MRI apparatus 100 in the present embodiment, a plurality of electric powers, which are supplied to the transmitter coil 107, are measured, and the electric power corresponding to a maximum magnetic resonance signal, among a plurality of magnetic resonance signals corresponding to the measured electric powers, is specified. By using the design electric power related to the generation of the maximum magnetic resonance signal and the specified electric power, the first correction coefficient $F_1$ and second correction coefficient $F_2$ can be determined. Specifically, according to the MRI apparatus 100, the receiver coil 109 is placed outside the imaging space, and the first correction coefficient $F_1$ can be determined by using the design electric power and the specified electric power. In addition, according to the MRI apparatus 100, the second correction coefficient $F_2$ can be determined by using the electric power, which is specified by receiving, by the receiver coil 109 placed inside the imaging space, a plurality of magnetic resonance signals generated by the load phantom or no-load phantom placed in the imaging space in accordance with the supply of plural electric powers to the transmitter coil 107, and by using the first correction coefficient $F_1$.

From the above, according to the MRI apparatus 100 in the present embodiment, in the calculation of the SAR, it is possible to correct, by using the first correction coefficient $F_1$, the transmission power of the radio frequency magnetic field which varies due to an error of the attachment position of the RF shield and WE coil at a time of installation of the MRI apparatus 100, an error relative to the design shape of the RF shield, and adjustment of the WB coil based on the performance in design of the WB coil. Furthermore, according to the MRI apparatus 100, in the calculation of the SAR, it is possible to correct, by using the second correction coefficient $F_2$, the transmission efficiency of the radio frequency magnetic field to the subject P, which varies due to the absorption of energy of the radio frequency magnetic field (decrease in transmission efficiency) by the receiver coil 109 (or transmitter/receiver coil) placed in the imaging space, and the excitation (increase in transmission efficiency) in the receiver coil 109 (or transmitter/receiver coil) due to this absorption.

Hence, according to the MRI apparatus 100 in this embodiment, the radio frequency magnetic field, which is absorbed in the subject P, can properly be estimated without being based on the pulse energy method, and without overestimating the SAR. Thereby, according to the MRI apparatus 100, since excessive restrictions are not imposed on the operation of the MRI apparatus 100, the usability of the MRI apparatus 100 can be enhanced.

According to the magnetic resonance apparatus 100 of the above-described embodiment, the SAR can properly be estimated, and the usability can be enhanced.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

The invention claimed is:

1. A magnetic resonance imaging apparatus comprising:
a transmitter coil configured to generate a radio frequency magnetic field;
a receiver coil configured to receive a magnetic resonance signal generated by an object placed in an imaging space to which the radio frequency magnetic field is applied; and
processing circuitry configured to calculate a specific absorption rate by using a first correction coefficient which indicates a characteristic that is inherent to the transmitter coil and relates to generation of the radio frequency magnetic field, and a second correction coefficient which indicates a characteristic that the receiver coil has on the radio frequency magnetic field by electromagnetic coupling between the receiver coil and the radio frequency magnetic field during a generation period of the radio frequency magnetic field.

2. The magnetic resonance imaging apparatus of claim 1, wherein the processing circuitry is configured to calculate the specific absorption rate, by further using a correlation between a power ratio and a body surface area of the subject, the power ratio indicating a ratio of an electric power accumulated in a subject to an electric power supplied to the transmitter coil.

3. The magnetic resonance imaging apparatus of claim 1, wherein the processing circuitry is configured to calculate the specific absorption rate by multiplying an electric power supplied to the transmitter coil by the first correction coefficient and the second correction coefficient.

4. The magnetic resonance imaging apparatus of claim 1, further comprising a measuring device configured to measure a plurality of electric powers which are supplied to the transmitter coil,
wherein the processing circuitry is configured to specify an electric power corresponding to a maximum magnetic resonance signal among a plurality of magnetic resonance signals corresponding to the measured electric powers, and configured to determine the first correction coefficient and the second correction coefficient by using a design electric power related to the generation of the maximum magnetic resonance signal, and the specified electric power.

5. The magnetic resonance imaging apparatus of claim 4, wherein the receiver coil is placed outside the imaging space,
the transmitter coil is a transmitter/receiver coil capable of receiving the magnetic resonance signal, and is configured to receive the plurality of magnetic resonance signals generated by a load phantom or a no-load phantom placed in the imaging space in accordance with the supply of the plurality of electric powers, and
the processing circuitry is configured to determine the first correction coefficient by using the specified electric power and the design electric power.

6. The magnetic resonance imaging apparatus of claim 4, wherein the receiver coil is placed inside the imaging space, and is configured to receive the plurality of magnetic resonance signals generated by a load phantom or a no-load phantom placed in the imaging space in accordance with the supply of the plurality of electric powers, and
the processing circuitry is configured to determine the second correction coefficient by using the specified electric power and the first correction coefficient.

* * * * *